United States Patent [19]

Wilwerding

[11] Patent Number: 4,882,262

[45] Date of Patent: Nov. 21, 1989

[54] SELF-ALIGNING APERTURE

[75] Inventor: Dennis J. Wilwerding, Littleton, Colo.

[73] Assignee: Honeywell Inc., Minneapolis, Minn.

[21] Appl. No.: 102,059

[22] Filed: Sep. 28, 1987

[51] Int. Cl.$^4$ ............................................... G03C 5/00
[52] U.S. Cl. ...................................... 430/321; 430/13; 430/946; 350/167; 350/417
[58] Field of Search ...................... 430/321, 20, 324, 4, 430/5, 7, 290, 13, 395, 946, 326; 350/417, 127, 128, 129, 167

[56] References Cited

U.S. PATENT DOCUMENTS

| | | | |
|---|---|---|---|
| 3,365,292 | 1/1968 | Fiore et al. | 430/25 X |
| 4,185,191 | 1/1980 | Stauffer | 250/204 |
| 4,425,501 | 1/1984 | Stauffer | 250/216 |
| 4,572,611 | 2/1986 | Bellman et al. | 350/167 |
| 4,647,519 | 3/1987 | Speigel | 430/25 |
| 4,670,095 | 6/1987 | Negishi | 156/655 |
| 4,695,719 | 9/1987 | Wilwerding | 250/216 |

FOREIGN PATENT DOCUMENTS

| | | | |
|---|---|---|---|
| 2658400 | 6/1978 | Fed. Rep. of Germany | 430/5 |
| 106420 | 8/1980 | Japan . | |

Primary Examiner—Jose G. Dees
Attorney, Agent, or Firm—Charles J. Ungemach

[57] ABSTRACT

An apparatus and method for creating an aperture between the lenslets of a lenslet array, which lenslet array has been produced by a process that leaves at least partially opaque barriers between the lenslets, comprising utilizing a photoresist over the entire surface of the lenslets and the spaces therebetween and shining ultraviolet light from the back of the array so that light exposes the photoresist in the lenslet portions and not in the areas therebetween.

10 Claims, 1 Drawing Sheet

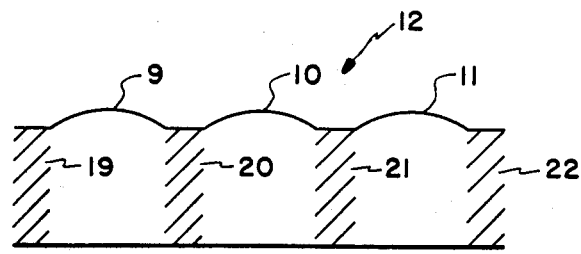
_Fig. 1_
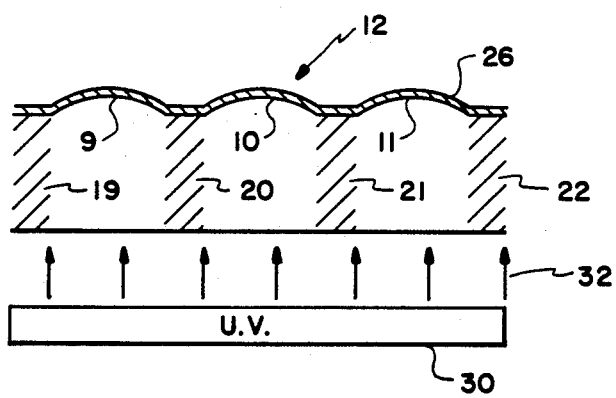
_Fig. 2_
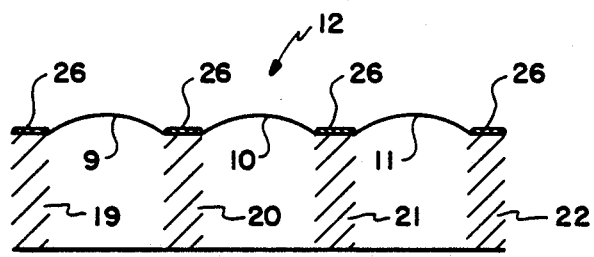
_Fig. 3_

SELF-ALIGNING APERTURE

BACKGROUND OF THE INVENTION

1. Field of the Invention

The present invention relates to an apparatus and method for producing an aperture for a lenslet array used, for example, in an autofocus camera.

2. Description of the Prior Art

In the Norman L. Stauffer U.S. Pat. No. 4,185,191, assigned to the assignee of the present invention, a range finding system for primary use in auto focus cameras is described utilizing a lenslet array with pairs of detectors behind each lenslet to receive radiation from a remote object and to produce, on the detector pairs, an image of the exit pupil of the camera taking lens. The detectors produce electrical signals for use by the system to determine the proper focus position for the remote object. In such a system, there is a need for a light blocking aperture between the lenslets to prevent radiation from reaching the detectors except by way of the lenslets. One aperture is shown in the Stauffer U.S. Pat. No. 4,425,501 where an opaque sheet or card with small holes therein is placed over the array so that the lenslets protrude through the holes. Another technique for forming the aperture is described in Japanese patent No. 55-106420 where the areas around the lenslets are painted or filled to block radiation. In my U.S. Pat. No. 4,695,719 assigned to the assignee of the present invention an aperture is created by solid state deposition techniques. All of these procedures require rather extensive labor to create the aperture and, in the case of the deposition technique, involve the making of a very accurate mask to expose a photoresist on the lenslet array to ultraviolet light. One solution to this latter problem has been proposed in the Rastko C. Maglic co-pending application Ser. No. 103,135 abandoned, Filed Sept. 28, 1987 and assigned to the assignee of the present invention.

In my co-pending application Ser. No. 020,634, filed Mar. 2, 1987 abandoned, and assigned to the assignee of the present invention, I disclosed a distributed aperture autofocus sensor which, utilizing a procedure described in the Robert H. Bellman U.S. Pat. No. 4,572,611, produces a lenslet array in which the individual lenslets are separated by columns of opaque partitions or barriers. These barriers extend between the lenslets throughout the material, usually glass, in which the lenslets are formed. As a result, cross over radiation from adjacent lenslets is reduced. Although in many cases, these barriers may take the place of an aperture, some radiation still penetrates the barriers making it desirable to have an aperture in addition to the barriers.

Any of the above described methods could be used to provide the desired aperture between the lenslets but each such method would continue to have the difficulties associated therewith.

BRIEF DESCRIPTION OF THE PRESENT INVENTION

I have discovered that an aperture can be created on the kind of lenslet array which has the rather opaque barriers described above, in a way which is self aligning, simple and does not require the high accuracy mask that was involved in the solid state deposition procedure mentioned above. This is accomplished by using a deposition procedure but instead of creating a very accurate mask, I use the rather opaque barriers themselves as the mask and exposing the photoresist material to the ultraviolet light from the backside of the lenslet array.

BRIEF DESCRIPTION OF THE DRAWINGS

FIG. 1 shows three members of a lenslet array;

FIG. 2 shows the lenslet array of FIG. 1 with a layer of photoresist thereover and being exposed to ultraviolet light from the backside of the array; and FIG. 3 shows the lenslet array of FIG. 2 after exposure to the ultraviolet light and with the removable photoresist having been washed away.

DETAILED DESCRIPTION OF THE PREFERRED EMBODIMENT

In FIG. 1, three lenslets 9, 10, and 11 of a lenslet array 12 are shown substantially as they appear in the above-mentioned co-pending application Ser. No. 020,634 abandoned. The lenslets are preferably created by a process such as is described in the above-mentioned Bellman U.S. Pat. No. 4,572,611 so as to leave vertical relatively opaque barriers 19, 20, 21, and 22 between adjacent lenslets. While not shown in FIG. 1, on the back side of the array underneath each of the lenslets 9, 10, and 11, a pair of detectors will be positioned to receive light that is transmitted through the lenslets. In an autofocus system such as is described in the above-mentioned Stauffer U.S. Pat. No. 4,185,191, the detectors will receive radiation from a remote object through the lenslets so as to produce output signals which are usable by the autofocus system to determine the range to the remote object.

Although the substantially opaque barriers 19, 20, 21, and 22 produce, themselves, a kind of aperture between the lenslet 9, 10, and 11 and do prevent much of the undesirable light from entering between the lenslets, it has been found desirable to have an additional aperture on top of these barriers and between the lenslets.

FIG. 2 shows the array 12 of FIG. 1 with a photoresist 26 distributed across the entire surface of the lenslets and the spaces therebetween. In one preferred embodiment, the photoresist 26 is mixed with a light blocking dye or is darkened by a photographic process so as to prevent light passing therethrough. A source of ultraviolet radiation 30 is shown underneath the lenslet array which shines ultraviolet light such as is shown by arrows 32 from the backside up through the material of the lenslets. It is seen that light will travel readily through the material to the lenslets 9, 10, and 11 so as to expose the photoresist material 26 thereupon but, because of the barriers 19, 20, 21, and 22, very little light will pass to the flat portions between the lenslets and thus these areas will remain unexposed. Accordingly, if a positive photoresist is employed, the photoresist above the lenslets will remain soft while the photoresist above the flat portions between the lenslets will harden. Since the photoresist material has been mixed with a light blocking stain or has been darkened by utilizing photographic techniques, then, when the lenslet array 12 is properly cleaned, the soft photoresist above the lenslets will be washed away while the photoresist on the flat portions above the barriers 19, 20, 21 and 22 will remain. This leaves an opaque aperture between the lenslets which will block the undesired light as will be seen in FIG. 3.

In FIG. 3, the array 12 is again shown, but now the photoresist material 26 has been washed away from the lenslets 9, 10, and 11 and remains only on the flat portions between the lenslets. It is seen that the desired aperture has been automatically aligned between the lenslets in a very simple and straightforward manner without the use of an accurately produced mask. The process also eliminates a number of steps in the prior art procedure of making apertures.

Of course, other ways of utilizing positive or negative photoresist and laying down masking material on the flat portions between the lenslets utilizing the above technique will occur to those skilled in the art. For example, in the above mentioned co-pending Rastko C. Maglic application, a procedure involving the use of a negative photoresist is described. With such a negative photoresist, the areas between the lenslets would remain soft while the areas above the lenslets would harden during the exposure to ultraviolet light from behind the lenslet array material. Then in the following cleansing step, the photoresist between lenslets would be removed but not that above the lenslets. At this time, an aperture material such as a layer of metal can be deposited on the whole surface including the lenslets and the areas therebetween. Finally, the photoresist and metal over the lenslets can be removed by an ultrasonic cleaning process leaving the deposited aperture material only on the areas between the lenslets. I therefore do not wish to be limited by the specific disclosures used in connection with the preferred embodiment but wish only to be limited by the following claims.

I claim:

1. The method of applying a material between the lenslets of a lenslet array, which array includes a body of material with a first surface upon which the lenslets are formed in first areas with second areas therebetween and a second surface spaced from the first surface and with at least partly opaque portions in said body extending between the first and second surfaces under only the second areas comprising the steps of:

A. applying a photoresist over the first surface;
   B. shining an ultraviolet light through the body of material from the second surface to the first surface, the at least partly opaque portion of the body blocking a portion of the light from reaching the second areas so that they are affected differently by the light than the first areas to facilitate photoresist removal in one of the first and second areas; and
   C. removing the photoresist from one of the first and second areas.

2. The method of claim 1 wherein the photoresist is a light blocking material.

3. The method of claim 2 wherein the photoresist is positive and the ultraviolet light of step B hardens the photoresist on the first areas only and step C removes only the photoresist from the first areas having light blocking material in the second area only.

4. The method of claim 3 wherein the light blocking material is a dye mixed with the photoresist.

5. The method of claim 3 wherein the light blocking material in the photoresist is darkened by a photographic process.

6. The method of forming an aperture on a lenslet array wherein the array is formed in a body of substantially transparent material having first and second surfaces with a first area on the first surface comprising a plurality of lenslets and a second area on the first surface comprising the portion of the first surface surrounding the lenslets and with at least partly opaque portions of the body extending between the first and second surfaces in back of only the second area, comprising the steps of:

A. applying a layer of photoresist to the first surface over the first and second areas;
   B. exposing the photoresist to ultraviolet light from a source throughout the body from the second surface to the first so that the partly opaque portions block some of the light and the first areas receive more ultraviolet light than the second areas so as to harden the photoresist on one of the first and second areas but not the other; and
   C. removing the unhardened photoresist from the first surface.

7. The method of claim 6 wherein the photoresist is positive and step C removes the photoresist on the first area.

8. The method of claim 7 wherein the photoresist is light blocking.

9. The method of claim 8 wherein the photoresist includes a darkened dye mixed therewith.

10. The method of claim 8 wherein the photoresist is darkened photographically.

* * * * *